(12) United States Patent
Henriksen (10) Patent No.: US 6,324,670 B1
(45) Date of Patent: Nov. 27, 2001

(54) CHECKSUM GENERATOR WITH MINIMUM OVERFLOW

(75) Inventor: Dana M. Henriksen, Lindon, UT (US)

(73) Assignee: Novell, Inc., Provo, UT (US)

( * ) Notice: Subject to any disclaimer, the term of this patent is extended or adjusted under 35 U.S.C. 154(b) by 0 days.

(21) Appl. No.: 09/275,201

(22) Filed: Mar. 24, 1999

(51) Int. Cl.[7] .......................... G06F 11/00; G06F 11/10; H03M 13/00
(52) U.S. Cl. .......................... 714/807; 714/799
(58) Field of Search ........................ 714/799, 807, 714/808, 809, 810; 370/252, 395, 419, 463

(56) References Cited

U.S. PATENT DOCUMENTS

| | | | |
|---|---|---|---|
| 4,065,752 | * 12/1977 | Goldberg | 714/807 |
| 5,500,864 | 3/1996 | Gonia et al. | 714/807 |
| 5,663,952 | 9/1997 | Gentry, Jr. | 370/252 |
| 5,912,909 | * 6/1999 | McCoy | 714/807 |

OTHER PUBLICATIONS

*What's MMX™ Technology*, ©1999 Intel Corporation.
*MMX™ Technology Technical Overview*, ©1999 Intel Corporation.

* cited by examiner

*Primary Examiner*—Emmanuel L. Moise
(74) *Attorney, Agent, or Firm*—Cesari and McKenna. LLP (57) ABSTRACT

A checksum generator includes at least one adding circuit for processing a segment of a given message. Associated with the adding circuit is a register for temporarily holding the partial sum that is being calculated by the adding circuit. The register is configured to hold a partial sum that is larger than the message segments being added by the adding circuit. The partial sums can thus expand into the register, eliminating the creation of a carry bit that must be added back in during each add cycle. After the last message segment has been processed, the adding circuit preferably adds the high order portion of the register to the low order portion and adds back any carry bit generated thereby to produce a checksum value that may be loaded into the given message.

20 Claims, 6 Drawing Sheets

CHECKSUM GENERATOR WITH MINIMUM OVERFLOW

FIELD OF THE INVENTION

This invention relates to computer networks and, more specifically, to a method and apparatus for efficiently calculating checksums to detect data transmission errors.

BACKGROUND OF THE INVENTION

In computer network systems, data is often encapsulated into data messages and transmitted among various entities of the system. A sending entity, for example, may formulate one or more data messages and transmit them across the network for receipt by a receiving entity. The receiving entity captures the data messages and retrieves the data. During transmission, however, errors can be introduced into the data. Accordingly, error control has become an integral part of computer network systems. One of the primary methods to control data transmission errors is known as error detection. With error detection, a receiving entity examines captured data messages to determine whether an error exists. If so, the receiving entity typically discards the data and requests its re-transmission.

One of the more well-known error detection techniques is to calculate and append a checksum valve to each data message. Typically, an agreed-upon algorithm (e.g., a parity check, cyclic redundancy check, hashing function, summation of the number of bits in the packet equal to 1, summation of the numerical values represented by the data, etc.) is applied to the contents of the message prior to its transmission so as to generate a corresponding checksum. The generated checksum is then appended to the data message by the sending entity and the message is transmitted across the network. Upon receipt of the message, the receiving entity applies the same, agreed-upon algorithm to the contents of the message and determines whether its calculation of the checksum matches the checksum contained in the message. If so, the receiving entity concludes that no errors were introduced into the message during its transmission and, therefore, continues processing the data. If the two values do not match, the receiving entity assumes that errors are present in the data and the message is typically discarded.

Figure 1:
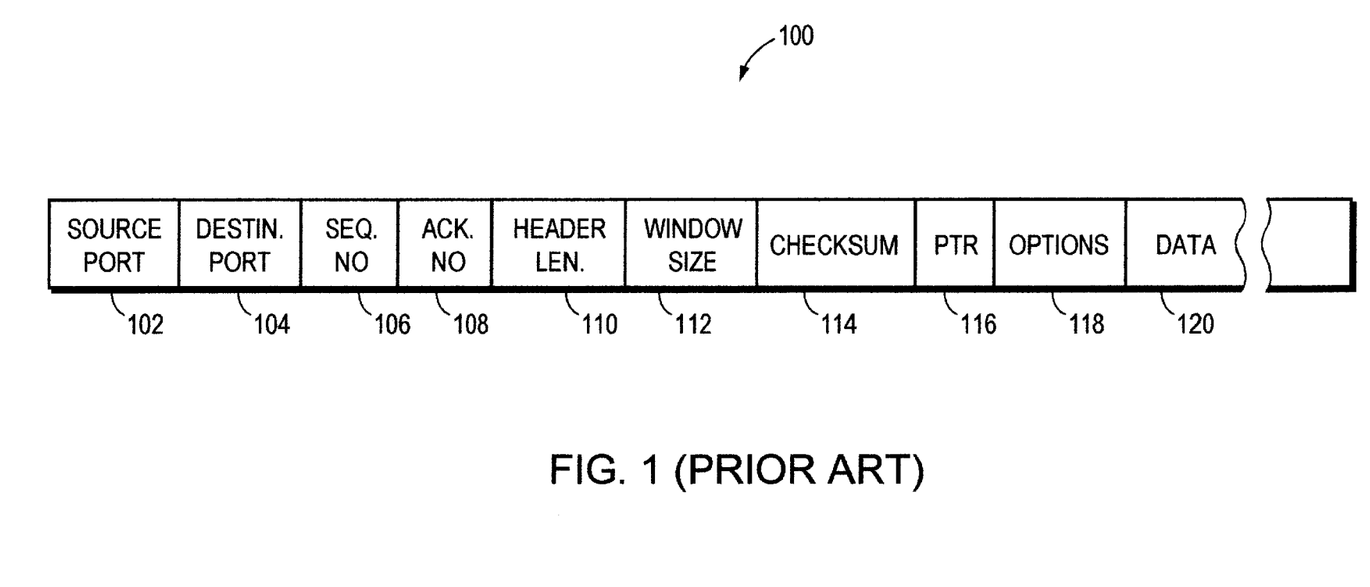
FIG. 1 is a block diagram of a conventional network data message.

FIG. 1 is a block diagram of a conventional network data message 100. Message 100, which corresponds to the well-known Transmission Control Protocol (TCP), includes a plurality of fields, including a source port field 102, a destination port field 104, a sequence number (SEQ. NO.) field 106, an acknowledgment number (ACK. NO.) field 108, a header length field 110, a window size field 112, a 16-bit checksum field 114, a pointer (PTR.) field 116, an options field 118 and a variable length data field 120 containing the contents of the message being transmitted. To calculate the checksum value pursuant to the TCP protocol, the checksum field 114 is initially set to zero and the data field 120 is padded with an additional zero byte if its length is an odd number. Next, the sending entity adds up all of the 16-bit portions of the message 100 in 1's complement and then the 1's complement of the sum is taken. In other words, all of the 16-bit portions of the message 100 are summed and the carry over values are added back into the sum. The 16-bit result is loaded into the checksum field 114 and the message 100 is transmitted across the network.

Checksum calculations can either be performed in software by the sending entity's central processor unit (CPU) or in a hardware circuit designed to calculate checksums. Several hardware circuits are known for calculating checksums. In a first checksum generation circuit, two 16-bit registers are used with an adder circuit. In operation, the first register is zeroed and the first 16-bit word of the message 100 is fetched into the second register. The two registers are then added together and result placed in the first register. The carry bit resulting from the add operation is then added into the first register and the circuit is ready for the next 16-bit word of the message 100, which is processed in the same manner. After the last 16-bit word has been processed and the carry bit added back to the first register, the first register will contain the checksum value for loading into the checksum field 114.

In another known checksum generation circuit, two 32-bit registers and a corresponding adder circuit are used. Here, the first register is zeroed and the first 32-bits of the message 100 are fetched into the second register. The two registers are then added together and the result placed in the first register. The carry bit resulting from the add operation is then added into the first register and the circuit is ready for the next 32-bit segment of the message 100, which is processed in the same manner. After the last 32-bit segment of the message 100 has been processed and the carry bit added to the first register, the low order 16 bits of the register are added to the high order 16 bits and the result loaded into the low order 16 bits of the first register. The carry bit from this last addition is then added back to the low order 16 bits, which represent the final checksum.

U.S. Pat. No. 5,663,952 entitled CHECKSUM GENERATION CIRCUIT AND METHOD to Gentry, Jr., is directed to a checksum generation circuit using two 16-bit adder circuits to generate checksums on a 32-bit data stream. Here, the data stream is split into two 16-bit words and each adder circuit processes a respective 16-bit segment. Each adder circuit also adds back the carry bit for each add cycle and stores the result in a corresponding 16-bit register. After the last 32-bit segment has been processed, three additional steps are performed to obtain the final 16-bit checksum value. First, the 16-bit results produced by each adder circuit are added together along with the last remaining carry bit from the first adder circuit. Second, the last remaining carry bit from the second adder circuit is added back. Third, any carry bit resulting from the second step is added back in, thereby generating the checksum value. The final 16-bit checksum may then be loaded into the respective message.

By operating on two 16-bit words in parallel, the checksum generator of the '952 patent purportedly speeds up the calculation of checksums. It nonetheless has several disadvantages. First, each addition step creates a resulting carry bit. This carry bit, moreover, must be added back in with the next addition step. Furthermore, the creation of any carry bit during the final processing must also be added back in to the final sum. Since most processors typically handle additions sequentially, the adding back of each carry bit requires an additional step consuming processor resources and time. Accordingly, a need has arisen to develop a checksum generator which can operate more efficiently.

SUMMARY OF THE INVENTION

Briefly, the present invention is directed to a method and apparatus for generating a checksum that minimizes the creation and manipulation of carry bits by allowing a "running sum" to expand into a register having a larger capacity than the size of the message segments being processed. In particular, a checksum generator includes at least one adding circuit for processing a given message in segments. Associated with the adding circuit is a register for temporarily holding the running sum that is being calculated by the adding circuit. According to the invention, the register is configured to hold a running sum that is larger than the message segments being added by the adding circuit. Preferably, the register is twice the size of the message segments being processed and is segregated into a high order portion and a low order portion. For example, the adding circuit may be configured to process 16-bit message words and the register may be configured to store a 32-bit running sum and segregated into a high order 16-bit portion and a low order 16-bit portion. By coupling the adding circuit to a register that is larger than the corresponding message segments, the adding circuit can allow the running sum to expand into the register, thereby eliminating the creation of a carry bit that must be added back during each add cycle. After the last message segment has been processed, the adding circuit preferably adds the high order portion of the register to the low order portion and places the result in the low order portion, creating a carry bit. The adding circuit adds back the carry bit to the low order portion, thereby generating a checksum that may be loaded into the message.

In a further aspect of the invention, the checksum generator includes two adding circuits operating in parallel. The two adding circuits are coupled to a register, which is apportioned into two sections, such that the output of each adding circuit may be loaded into a respective section of the register. At least one of the register sections is further apportioned into a low order portion and a high order portion. The adding circuits, moreover, are configured to add a received message segment to the contents of their respective register sections and to store the result in their register sections. Each section of the register is larger than the message segments being processed by the adding circuits. Accordingly, each register section is able to hold a running sum without creating a carry bit that must be separately processed by the respective adding circuit. After the entire message has been processed, one of the adding circuits adds the contents of the two register sections together and places the result in a first section of the register, creating a first carry bit. The first carry bit is added back to the contents of the first register section and the new result loaded into the first register section. Next, the adding circuit adds the low order portion to the high order portion of the first register section, creating a second carry bit. The second carry bit is added back to the contents of the low order portion of the first register section, thereby generating a checksum that may be loaded into the respective message.

BRIEF DESCRIPTION OF THE DRAWINGS

The invention description below refers to the accompanying drawings, of which.

DETAILED DESCRIPTION OF AN ILLUSTRATIVE EMBODIMENT

Figure 2:
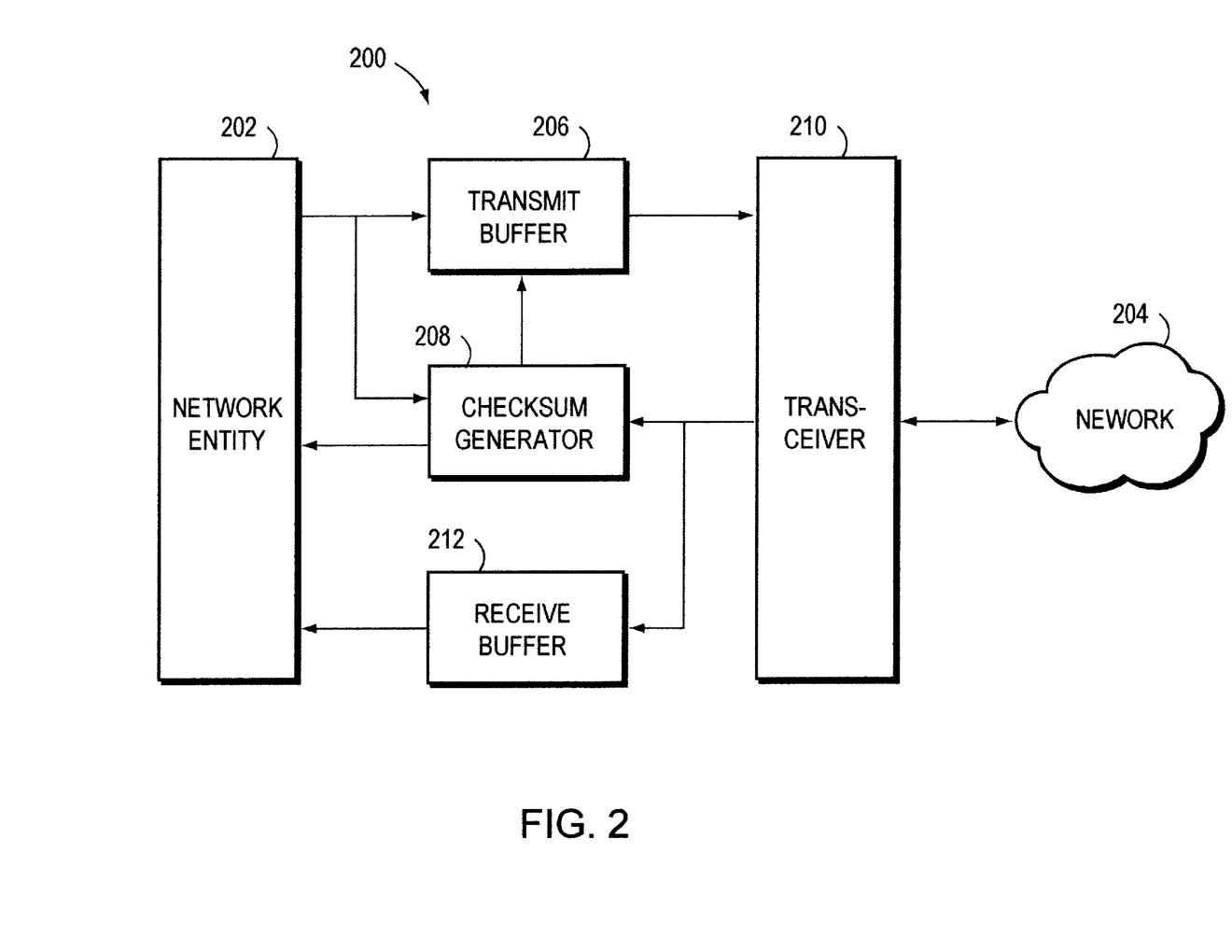
FIG. 2 is a highly schematic block diagram of a network interface.

FIG. 2 is a highly schematic block diagram of a network interface 200 for coupling a network entity 202 to a computer network 204. The interface 200 includes a transmit buffer 206, a checksum generator 208 in accordance with the present invention, a transceiver 210, which is coupled to the computer network 204, and a receive buffer 212. Messages, such as packets 100 (FIG. 1) corresponding to the Transmission Control Protocol (TCP), are formulated by entity 202 and forwarded to the transmit buffer 206 and checksum generator 208 of the network interface 200. The checksum generator 208 calculates a checksum value for the packet as it is being loaded into the transmit buffer 206. The calculated checksum value from the checksum generator 208 is then loaded into the checksum field 114 and the message 100 is passed to the transceiver 210. The transceiver 210 places the message 100 onto the network 204 for receipt by the intended receiving entity.

Those skilled in the art will recognize that the transceiver 210 and/or other network interface components may perform additional functions, such as converting the message 100 to other protocol formats, such as the Internet Protocol (IP) and/or Token Ring or Ethernet local area network (LAN) standards, etc.

Messages, such as TCP packets 100, intended for entity 202 are captured from the network 204 by the transceiver 210 and passed to both the receive buffer 212 and checksum generator 208. The checksum generator 208 calculates a checksum value for the TCP packet 100 as it is loaded into the receive buffer 212. The packet 100 from receive buffer 212 and the calculated checksum value from the checksum generator 208 are then forwarded to the entity 202. Entity 202 may then compare the calculated checksum value with the contents of the checksum field 114 of the received packet 100. If the values match, entity 202 assumes that the message has not been corrupted and processes it. If the values do not match, entity 202 discards the message and requests or simply waits for retransmission of the message.

Figure 3:
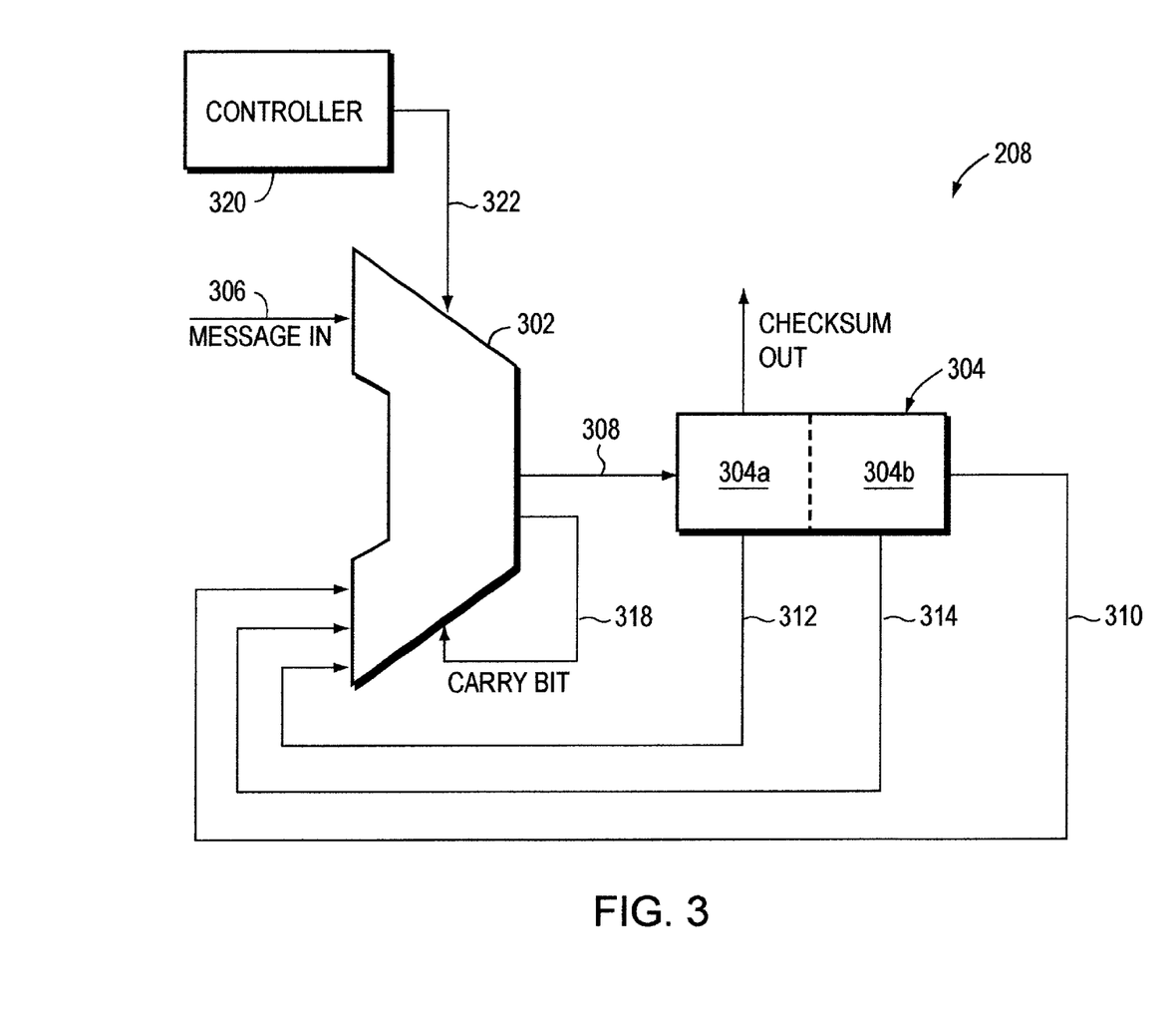
FIG. 3 is a highly schematic block diagram of the checksum generator of the present invention.

FIG. 3 is a highly schematic block diagram of the checksum generator 208 of FIG. 2. The checksum generator 208 includes at least one adding circuit 302 and a corresponding register 304. The register 304, moreover, is preferably segregated into at least two portions; a low order bit portion 304a and a high order bit portion 304b. An input 306 provides the message being processed to the adding circuit 302. An output 308 of the adding circuit 302 provides its results to the register 304. The register 304 and each portion 304b, 304b thereof are also individually looped-back as inputs to the adding circuit 302 by corresponding lines 310, 312 and 314, respectively. To the extent a carry bit is generated by the adding circuit 302, it may be looped back as an input by a carry bit line 318.

A controller 320, which provides a control input 322 to the adding circuit 302, governs its operation. The main function of the controller 320 is to direct the adding circuit 302 to select one of the various inputs upon which it is to operate and where to deliver its result, depending on the stage of the processing, as described below. The controller 320 may include one or more selector or multiplexing functions (not shown).

According to the invention, the register 304 is selected to be larger than the individual message segments received at input 306 by the adding circuit 302. Preferably, register 304 is twice the size of the message segments. For example, if adding circuit 302 is receiving and processing 16-bit data words, the register 304 is a 32-bit register.

Preferably, the checksum generator 208 operates as follows. First, register 304 is initialed to a null value (e.g., zero). Next, message segments are sequentially received at the adding circuit 302 from the entity 202 via input 306. More specifically, adding circuit 302 receives 16-bit data words on input 306 under the direction of the controller 320. Adding circuit 302 retrieves the entire contents of the register 304 via line 310 and adds this retrieved value to the received 16-bit word from input 306. The result is loaded by the adding circuit 302 into the register 304 via line 308 starting with the low order bit portion 304a, thereby overwriting its current contents. Since the register 304 can accommodate results that are greater than 16-bits, there is no need for the adding circuit 302 to store or add back in a carry bit during the next cycle. Instead, the result simply expands into the register 304, starting with the low order bit portion 304a and expanding into the high order bit portion 304b of the register 304.

After loading its result into the register 304, the adding circuit 302 receives another 16-bit word on input 306, retrieves the partial sum contained in register 304 and adds the two values together. The result is again loaded into the register 304 including any "carry bit". This process is repeated for each 16-bit word of the message 100 received at the adding circuit 302. After the last 16-bit word from input 306 has been processed, as described above, adding circuit 302, through operation of the controller 320, separately retrieves the contents of the low order bit portion 304a and the high order bit portion 304b of register 304 via lines 312, 314 respectively. Adding circuit 302 then adds these two values together and loads the result into the low order bit portion 304a of the register 304 via output 308. The result of this step may produce a carry bit since the result of adding two 16-bit values is being loaded back into a 16-bit portion of the register 304. Adding circuit 302, under the direction of the controller 320, next retrieves the contents of the low order bit portion 304a of the register 304 via line 312 and adds back the previously produced carry bit via carry bit return line 318. The result is again loaded into the low order bit portion 304a of the register 304. With the single carry bit added back into the sum of the two portions 304a, 304b, the low order bit portion 304a of the register 304 will contain the 16-bit final checksum. This value may then be loaded into the checksum field 114 of the respective TCP packet 100.

As shown, the checksum generator of the present invention is able to calculate a checksum with only a single carry bit operation per message. Accordingly, it is able to process messages much more quickly and efficiently than the prior art checksum generators, which typically create a carry bit at each addition cycle that must be subsequently added back in during the next cycle.

Figure 4:
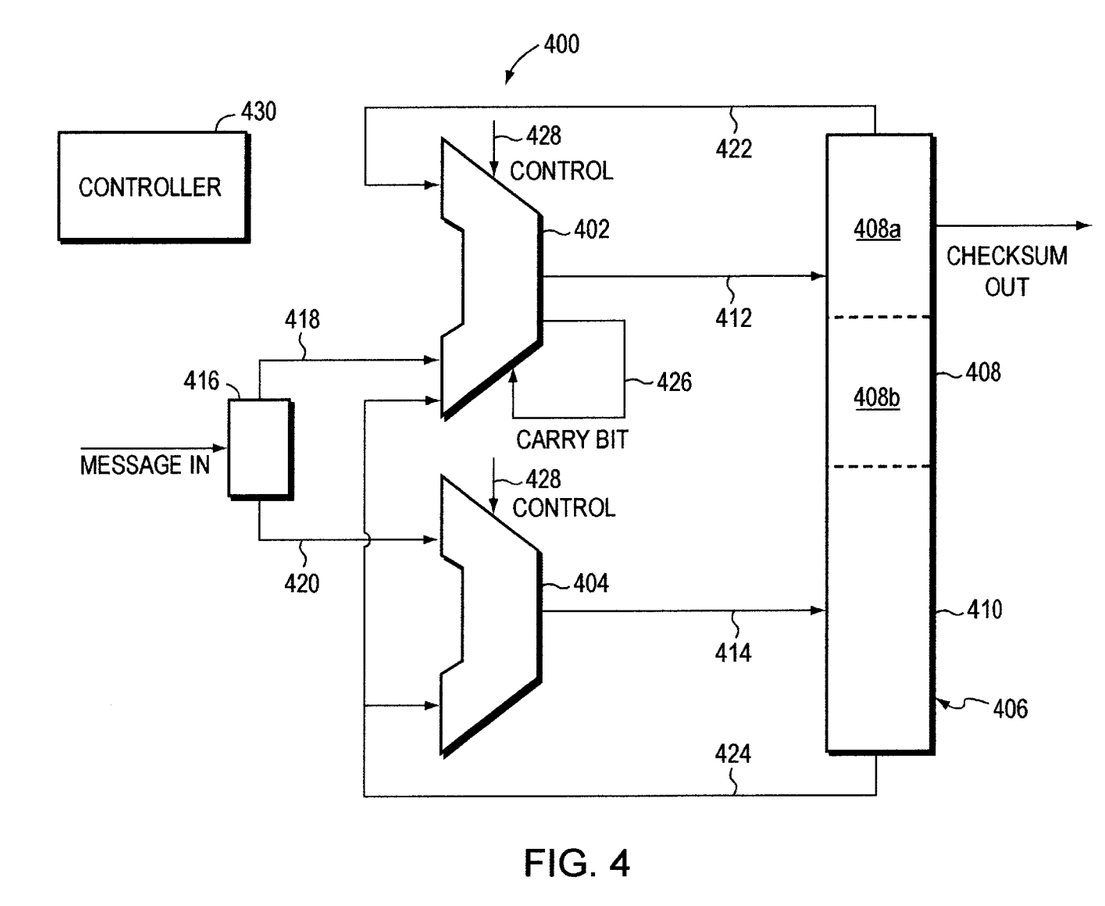
FIG. 4 is a highly schematic block diagram of an alternative embodiment of the checksum generator of the present invention.

FIG. 4 is a highly schematic block diagram of an alternative embodiment of a checksum generator 400 in accordance with the present invention. Here, the checksum generator 400 includes two adding circuits 402 and 404 and at least one register 406. The register 406, moreover, is apportioned into two sections 408 and 410. At least one register section, such as register section 408, is further apportioned into a low order bit portion 408a and a high order bit portion 408b. Each adding circuit 402, 404 includes an output 412, 414, respectively, that is coupled to a respective section of the register 406. For example, the output 412 of adding circuit 402 may be coupled to register section 408, while the output 414 of adding circuit 404 may be coupled to register section 410. A parsing circuit 416 is configured to receive portions of a message, such as a TCP packet 100 (FIG. 1), divide the message portion into two message segments and provide the two message segments to the adding circuits 402, 404 as inputs along corresponding input lines 418, 420, respectively.

Each adding circuit 402, 404 is also coupled to receive the contents of its respective register section 408, 410 as an input. More specifically, register section 408 is coupled to adding circuit 402 by line 422 and register section 410 is coupled to adding circuit 404 by line 424. Line 424 also supplies the contents of register section 410 to adding circuit 402. To the extent a carry bit may be created by at least one of the adding circuits, such as adding circuit 402, it is looped back as an input by a carry bit line 426. Each adding circuit 402, 404 also receives a control input 428 from a controller 430 for governing its operation, as described below.

In the preferred embodiment, register 406 is a 64-bit register and sections 408 and 410 are each 32-bits. Furthermore, the low and high order bit portions 408a, 408b are each 16-bits.

In operation, register 406 is initialized to a null value (e.g., zero). Next, portions of a message, such as a TCP packet 100, are received at parsing circuit 416 in 32-bit increments. Parsing circuit 416 divides each 32-bit increment into two corresponding 16-bit words and forwards one to each of the adding circuits 402, 404 along input lines 418, 420, respectively. Each adding circuit 402, 404, under the direction of the controller 430, retrieves the partial sum contained in its register section 408, 410 and adds that partial sum to its received 16-bit data word. The result from each adding circuit 402, 404 is then loaded into its respective register section 408, 410, overwriting its previous contents. This process is repeated for each 16-bit word received by the adding circuits 402, 404 from the parsing circuit 416.

After the last 16-bit words have been processed, adding circuit 402, under the direction of the controller 430, retrieves the contents of register section 410 along line 424 and the contents of register section 408 along line 422. These two values are added together and the result loaded into register section 408. To the extent a carry bit is generated during this addition cycle, it is added back to the contents of register section 408 by adding circuit 402 via carry bit line 426 and the new result is loaded into register section 408. Depending on the size of the register section (e.g., register section 408) into which this intermediate result is stored or loaded, a carry bit may or may not be created. Adding circuit 402 next retrieves the contents of the 16-bit low order portion 408a and the contents of the 16-bit high order portion 408b, through operation of the controller 430, and adds these two values together. The result is loaded into the 16-bit low order portion 408a of register section 408. To the extent a carry bit is generated during this last add cycle, it is added back to the contents of the low order bit portion 408a via carry bit line 426 and the new result is loaded into the low order bit portion 408a. The contents of the 16-bit low order portion 408a of register section 408 represent the checksum value and may be loaded into the checksum field 114 of the respective TCP packet 100.

As shown, the checksum generator of FIG. 4 is able to calculate a checksum by operating on two 16-bit data words in parallel and yet only generate at most two carry bit operations per TCP packet. This reduction in carry bit operations as compared with the prior art checksum generators results in faster, more efficient processing by the checksum generator of the present invention.

Although the present invention has heretofore been described in connection with computer hardware components, those skilled in the art will understand that the invention may also be implemented through software instructions. Indeed, a preferred embodiment of the present is implemented in software utilizing a Pentium® processor with MMX™ technology from Intel Corp. In this embodiment, the present invention may comprise one or more computer software modules or libraries pertaining to the methods described herein and executable by one or more programmable processing elements. Other computer readable media may also be used to store the program instructions for execution.

Figure 5A:
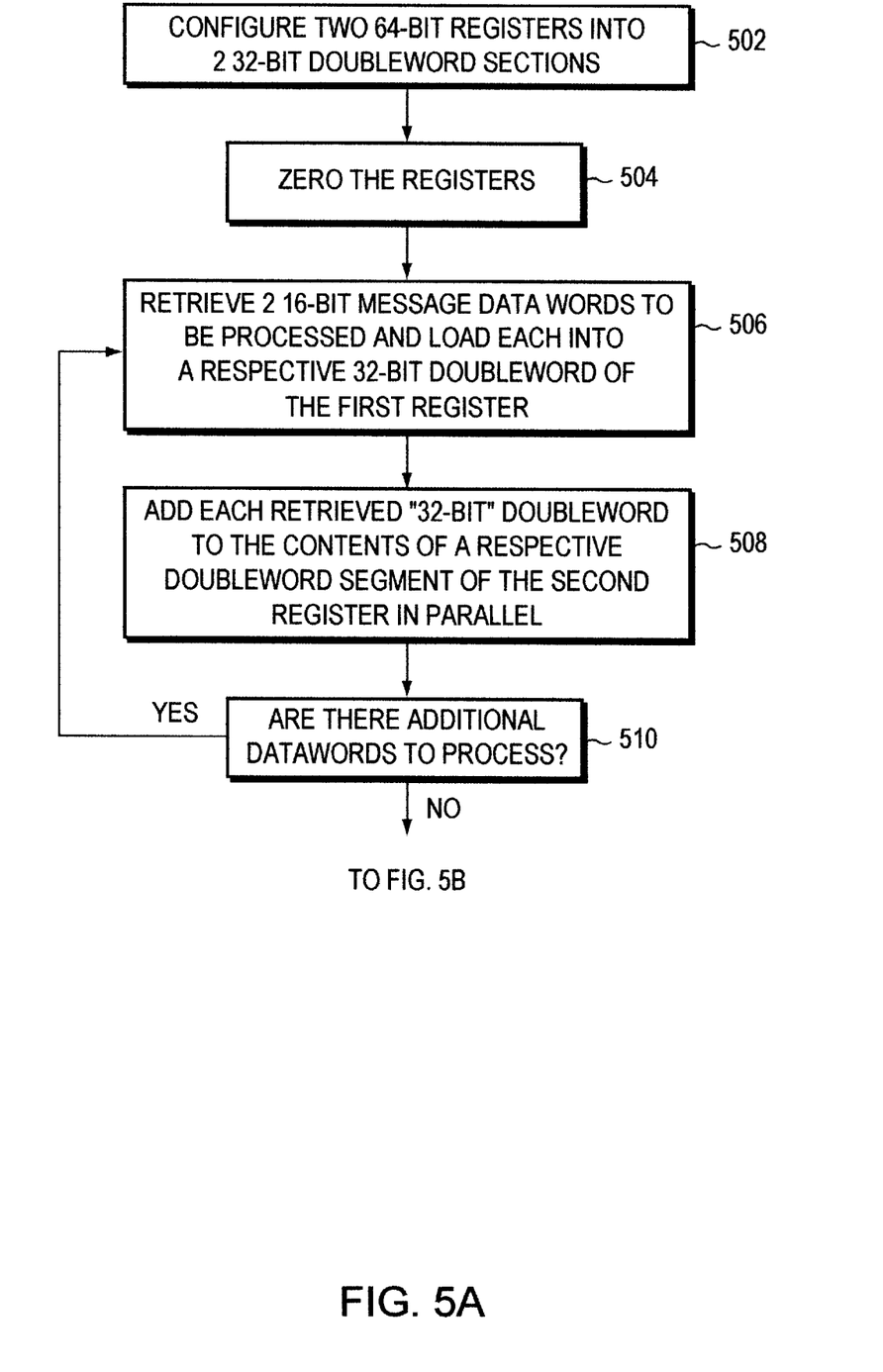
FIGS. 5A and 5B are a flow diagram of the steps of the present invention.
Figure 5B:
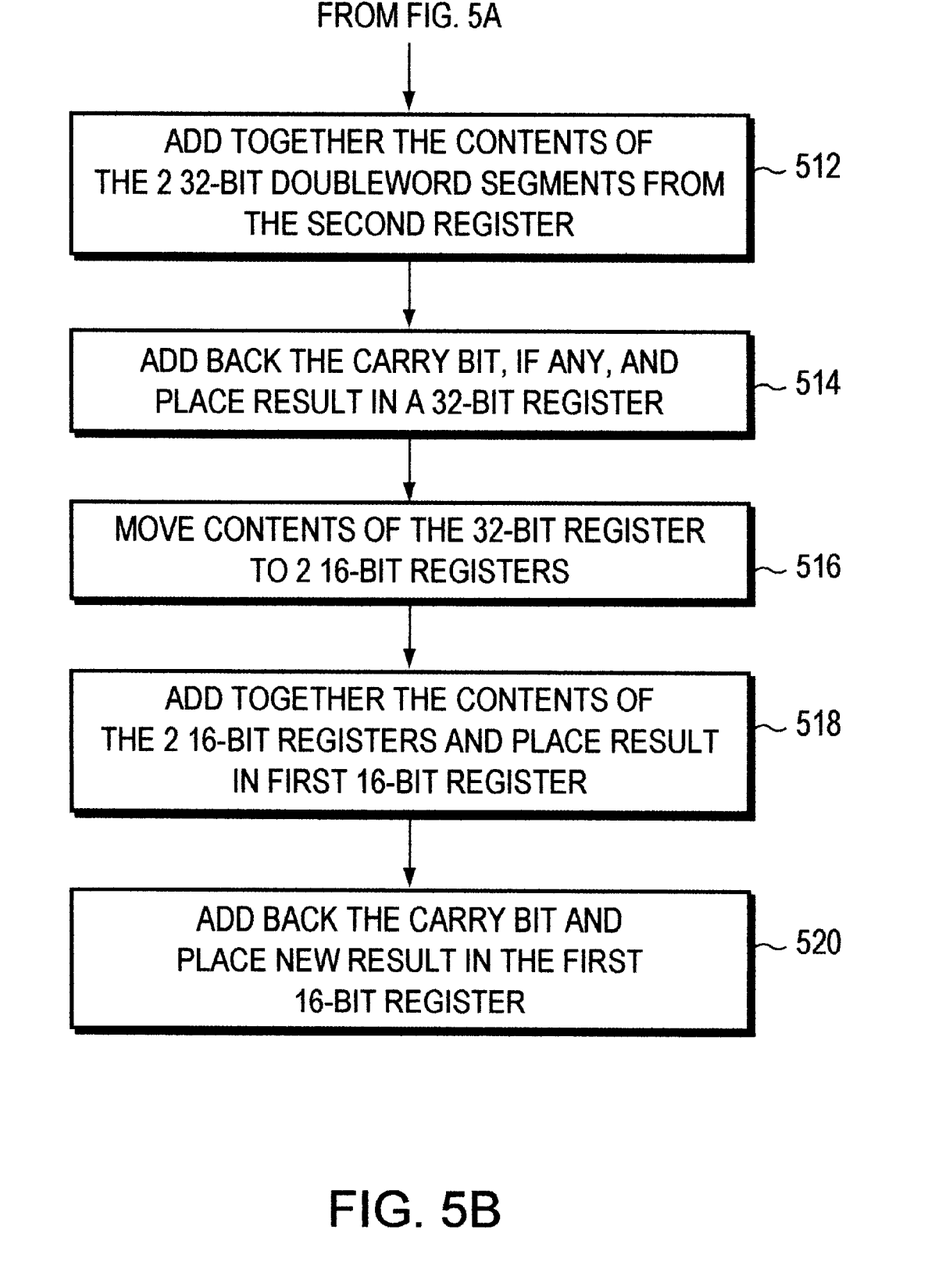

FIGS. 5A and 5B are a flow diagram of the steps performed according to this embodiment. First, two data registers, each of which preferably corresponds to a 64-bit MMX™ register, are configured into two 32-bit doublewords, as indicated at block 502. Next, the two registers are initialized to a null value (e.g., zero), as indicated by block 504. A pair of 16-bit data words from the message being processed are then retrieved and loaded into the two 32-bit doublewords of the first register, as indicated at block 506. More specifically, each 16-bit data word is loaded into the low order 16-bit portion of its respective 32-bit doubleword, leaving the high order 16-bit portion of each doubleword at null or zero. Next, each 32-bit doubleword of the first register is added to a respective 32-bit doubleword of the second register and the result is loaded into the respective 32-bit doubleword of the second register, as indicated at block 508. In order to perform the add operation on the two registers, an MMX™ instruction, such as "PADDD" (which means add with wrap-around on doubleword), is preferably performed. This process is repeated until all of the 16-bit data words of the message have been processed, as indicated by decision block 510.

It should be understood that Intel's MMX™ technology allows the add operation to be performed in parallel for each pair of 32-bit doublewords from the two 64-bit registers. Furthermore, since each "32-bit" doubleword in the first register is actually a 16-bit word (with the high order bit portions zeroed), no carry bit is created as a result of the add operation and thus the running sum can simply expand into its respective 32-bit double-word section.

After the last set of data words have been processed, the contents of the two 32-bit doublewords in the second register are moved to two separate 32-bit registers (e.g., non-MMX™ registers) and added together, as indicated at block 512. Here, a conventional add operation for the x86 series of processors from Intel Corp. may be utilized on the two 32-bit registers and the result is preferably placed in the first 32-bit register. To the extent a carry bit is created by this last add operation, it is then added back in and the new result is again loaded into the first 32-bit register, as indicated at block 514. The contents of the first 32-bit register are then moved to two 16-bit registers, as indicated at block 516. More specifically, the high order 16-bits are placed in one 16-bit register and the low order 16-bits are placed in the other 16-bit register. Next, the two 16-bit registers are added together and the result is loaded into the first 16-bit register, as indicated at block 518. Again, a conventional x86 add operation may be utilized. The carry bit from this last add cycle is added back in to the contents of the first 16-bit register and the final result is again placed in the first 16-bit register, as indicated at block 520. The contents of the first 16-bit register represent the calculated 16-bit checksum and may be transferred into the checksum field 114 (FIG. 1) of the respective TCP packet 100.

It should be understood that the present invention may also be applied to the generation of checksums for other computer network messages. For example, the invention may be used to generate checksums for messages corresponding to the User Datagram Protocol (UDP), the Internet Packet exchange (IPX) protocol, the AppleTalk protocols, etc. It should be further understood that the functional components of the present invention may alternatively be constructed from various combinations of hardware and software elements without departing from the intended scope of the invention. Furthermore, those skilled in the art will recognize that one or more data registers, each apportioned into one or more sections, may be utilized to implement the invention.

The foregoing description has been directed to specific embodiments of this invention. It will be apparent, however, that other variations and modifications may be made to the described embodiments, with the attainment of some or all of their advantages. For example, the checksum generator of the present invention may be configured to efficiently calculate checksum values of different sizes, such as 32-bit checksums for Token Ring or Ethernet frames. Therefore, it is the object of the appended claims to cover all such variations and modifications as come within the true spirit and scope of the invention.

What is claimed is:

1. A checksum generator for calculating a checksum value for a given message, the checksum generator comprising:
   at least one adder having first and second inputs, a sum output and a carry-bit return, the first input configured to receive a plurality of message segments, each message segment being n-bits in length; and
   at least one register coupled to the sum output to temporarily store a partial sum from the at least one adder, and to the second input to return its contents to the at least one adder, the register configured so as to be greater in size than the n-bit message segments received by the adder.

2. The checksum generator of claim 1 wherein the at least one adder performs an add operation on each received message segment and the register contents to generate a corresponding partial sum, and further wherein the corresponding partial sum is stored at the register such that the add operation is free from creating from a carry bit.

3. The checksum generator of claim 2 wherein the register is apportioned into two sections and the at least one adder, in response to processing a last message segment, performs an add operation on the partial sum of the two register sections and adds back any carry bit created thereby to generate the checksum value.

4. The checksum generator of claim 3 wherein the checksum value is temporarily stored at one of the register sections.

5. The checksum generator of claim 4 wherein the size of the register is 2 times n.

6. The checksum generator of claim 4 wherein each message segment is 16-bits, the size of the register is 32-bits and the two register sections are each 16-bits.

7. The checksum generator of claim 1 wherein the size of the register is 2 times n.

8. The checksum generator of claim 1 wherein each message segment is one of 16-bits and 32-bits, the size of the register is one of 32-bits and 64-bits, and the two register sections are one of 16-bits and 32-bits.

9. A checksum generator for calculating a checksum value for a given message, the checksum generator comprising:
   two or more adders each having first and second inputs and a sum output, at least one adder having a carry-bit return, the first input of each adder configured to receive a plurality of message segments, each being n-bits in length; and
   at least one register apportioned into two or more sections each coupled to the sum output of a respective adder to temporarily store a partial sum from the respective adder, each register section coupled to the second input of its respective adder to return its contents to the respective adder, each register section configured to be greater in size than the n-bit message segments received by the two or more adders.

10. The checksum generator of claim 9 wherein each adder performs an add operation on each received message segment and the contents of its respective register section in parallel to generate a corresponding partial sum, and further wherein the corresponding partial sum from each adder is stored at its respective register section such that the add operation for each adder is free from creating from a carry bit.

11. The checksum generator of claim 10 wherein, in response to processing a last message segment, one adder performs an add with carry operation on the partial sum in each of the register sections to generate a result that is placed in a first register section.

12. The checksum generator of claim 11 wherein the first register section is apportioned into first and second portions and further wherein one adder performs an add operation on the first and second portions and adds back any carry bit created thereby to generate the checksum value.

13. The checksum generator of claim 12 wherein the size of each register section is 2 times n and the two portions of the first register are each ½ times n.

14. The checksum generator of claim 12 wherein each message segment is 16-bits, the size of each register section is 32-bits and the two portions of the first register section are each 16-bits.

15. A method for generating a checksum value for a given message split into one or more message streams, each message stream corresponding to a plurality of message segments each having a length of n-bits, the method comprising the steps of:

configuring at least one data register into one or more sections for temporarily storing a partial sum, each register section having a size that is greater than n-bits;

associating each of the one or more message streams with a selected register section;

summing each message segment from the respective message streams with its associated register section to create a partial sum;

placing the partial sums for each message stream in its associated register section such that the summing step is free from creating carry bits due to the one or more register sections being greater than n-bits in size;

in response to summing last message segments in each message stream, adding the one or more register sections to create a first intermediate sum;

placing the first intermediate sum in a first register section;

apportioning the first register section into first and second register portions;

adding the first and second register portions to create a second intermediate sum and a first carry value; and adding the second intermediate sum and the first carry value to obtain the checksum value.

16. The method of claim 15 wherein the step of summing the message segments from the one or more message streams is performed in parallel.

17. The method of claim 16 further comprising the step of configuring each message segment to have a size equal to ½ its respective register section.

18. The method of claim 17 wherein the message segments are each 16-bits, the at least one register is 64-bits in size, the register sections are 32-bits in size and the first and second register portions are 16-bits in size.

19. The method of claim 18 further comprising the step of appending the calculated checksum value to the given message.

20. The method of claim 15 wherein the step of adding the one or more register sections further creates a second carry value and the method further comprises the step of adding back in the second carry value to the first intermediate sum.

* * * * *